United States Patent [19]
Mori

[11] Patent Number: 5,260,905
[45] Date of Patent: Nov. 9, 1993

[54] MULTI-PORT MEMORY
[75] Inventor: Toshiki Mori, Ibaraki, Japan
[73] Assignee: Matsushita Electric Industrial Co., Ltd., Osaka, Japan
[21] Appl. No.: 753,882
[22] Filed: Sep. 3, 1991
[30] Foreign Application Priority Data
  Sep. 3, 1990 [JP] Japan ............................ 2-233543
[51] Int. Cl.⁵ .............................................. G11C 8/00
[52] U.S. Cl. ........................... 365/230.05; 365/230.09; 365/189.12; 365/240
[58] Field of Search ................... 365/230.05, 239, 240, 365/230.09, 189.12, 221, 189.05
[56] References Cited
  FOREIGN PATENT DOCUMENTS
  2-158996 6/1990 Japan ............................ 365/230.05

OTHER PUBLICATIONS
*Nikkei Electronics*, pp. 195–219 (May 20, 1985).

Primary Examiner—Joseph A. Popek
Attorney, Agent, or Firm—Willian Brinks Olds Hofer Gilson & Lione

[57] ABSTRACT

The multi-port memory of the present invention is provided with a random port for describing the graphic data, a first serial port for reading the data to be displayed, and a second serial port for writing the dynamic picture image data and which has a transfer mask register to transfer the dynamic picture image to a window. The multi-port memory enables multi-window display of the dynamic picture images in a simple circuit structure, with ensuring high-speed erasure and scroll of the multi-window.

5 Claims, 8 Drawing Sheets

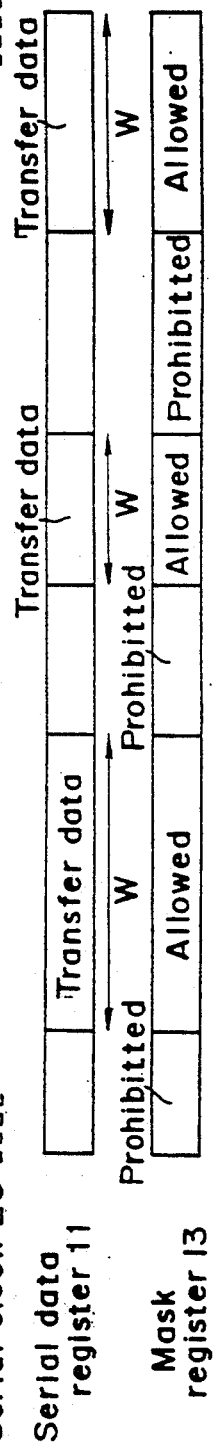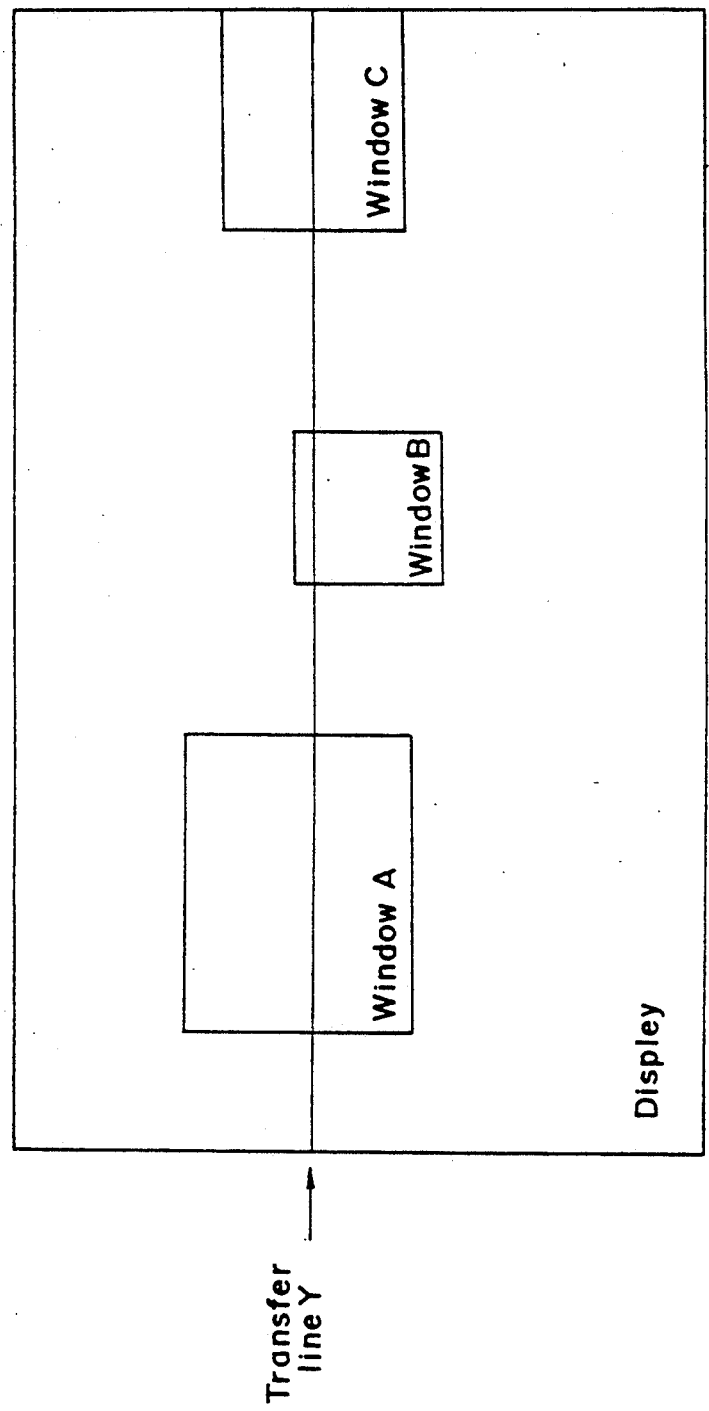
Fig. 3

MULTI-PORT MEMORY

BACKGROUND OF THE INVENTION

1. Field of the Invention

The present invention generally relates to a semiconductor memory device and, more particularly to a multi-port memory suitable for use as an image memory.

2. Description of the Prior Art

In an image display apparatus in order to display image data of figures, characters, etc. composited by a computer onto a raster-scanning type CRT screen, a memory called a frame buffer is needed to store the image data. A dual-port memory is generally used as the memory for the above purpose, having a random access memory and a serial access memory. Furthermore, the dual port memory generally contains a random port for writing into the random access memory the image data formed by the computer which is to be generated at an optional position on the CRT. Additionally, the dual port memory contains serial port for transferring data of one line in the random access memory to the serial access memory and reading the consecutive data necessary for the display onto the CRT from the serial access memory.

The dual-port memory referred to above is disclosed, for instance, in "Nikkei Electronics", pp195-219, May 20, 1985 edition by Nikkei MacGrow Hill, i the structure as shown in FIG. 6. In FIG. 6, a random access memory 30 consists of memory cell array 1, a row decoder 6 and a column decoder 7. A serial access memory 31 consists of a serial data register 2 for storing data transferred from the memory cell array 1, a serial address counter 8 for counting serial clocks and a data selector 3 for selecting an arbitrary bit of data stored in the serial data register 2 according to respective outputs from the serial address counter 8.

Reference numerals 20-24 denote terminals of input-/output signals and control signals to realize input/output means to the dual-port memory. More specifically, reference numerals 20-22 are signal terminals of the random port, i.e., an input/output terminal of random data, an input terminal of address signals and an input terminal of control signals, respectively. The control signals such as $\overline{RAS}$, $\overline{CAS}$, $\overline{DT/OE}$ and the like fed through the input terminal 22 are input to a controller 9, thereby controlling inside (i.e. internal) operations of the memory. On the other hand, signal terminals 23, 24 of the serial port indicate an input terminal 23 of serial clocks counted by the serial address counter 8 and an output terminal 24 of serial data through which serial data stored in the serial data register 2 is output.

Upon writing the image data into an arbitrary position of the memory array 1 from the random port, a row address and a column address for the memory array 1 are, through the address signal input terminal 21 in a time sharing manner, taken into the address buffers 4, 5 in accordance with control signals C1 and C2 from the controller 9 and input to the row decoder 6 and column decoder 7, thereby accessing the arbitrary position of the memory array 1. In the above manner, the image data input to the random data input/output terminal 20 is written into the position accessed.

Meanwhile, upon reading the image data from the memory array 1 to the random port, an arbitrary position of the memory array 1 is accessed to in the same manner as the aforementioned image data writing process position of the memory array accessed is determined in accordance with the control signals C1 and C2 from the controller 9.

In order to read the serial data from the serial port, a transfer gate 16 is controlled by a control signal G1 generated from controller 9 by control signals to the control signal input terminal 22, whereby the data of one line in the memory array 1 selected by the row address is transferred to the serial data register 2. The serial address input to the address signal input terminal 21 is loaded in the serial address counter 8. The data selector 3 selects and outputs the data at a bit position of the serial data register 2 designated by the output from the serial address counter 8 to the serial data output terminal 24. As the serial address counter 8 counts the serial clock cycles input through the serial clock input terminal 23, the position of the serial data register 2 selected by the data selector 3 moves sequentially to higher order bits, and accordingly the data of the serial data register 2 is sequentially read out.

FIG. 7 is a timing chart showing the serial data transfer and reading thereof. The input-signals to the control signal input terminal 22 are, a $\overline{RAS}$ signal for controlling the timing to input a row address, a $\overline{CAS}$ signal for controlling the timing to input a column address and a $\overline{DT/OE}$ signal for controlling the transfer of serial data. At a time t1 when $\overline{RAS}$ signal falls, a line address Al of the memory array 1 to transfer the serial data from the address signal input terminal 21, and a logic "0" signal as the $\overline{DT/OE}$ signal indicating the transfer cycle of the serial data is input. As a result, a time t3 when the $\overline{DT/OE}$ signal rises, data of the selected line of the memory array 1 is transferred to the serial data register 2 through the transfer gate 16.

An address showing a starting position for reading from the serial data register 2 is loaded in the serial address counter 8 by an address A2 input at time t2 when the $\overline{CAS}$ signal falls. The serial data transferred to the serial data register 2 is sequentially read out in synchronization with the rising edge of the serial clock 23 which is input after time t3. In this case, a serial data C0, which is read out first is the data of the serial data register 2 at the position selected by the address A2 loaded in the serial address counter 8. Afterwards, the content in the serial data register 2 is sequentially read out as C1, C2, C3, . . . as the serial address counter 8 counts up in a synchronous manner with the serial clock cycles input through the serial clock input terminal 23.

Accessing the memory array through the random port is possible while the data is being read out from the serial data register 2, and this can be used for writing the image data into the memory array 1. Therefore, the imaging speed of the image data is improved.

However, various functions require the image display apparatus to achieve a multi-window display. That is, not only the image data of figures, characters and the like composited by a compute but also dynamic picture images such as video images, etc. are desired to be displayed on the same screen. Since the conventional dual-port memory is provided with the serial port having the serial data register in addition to the random port capable of accessing any arbitrary position of the memory array, if the dual-port memory is used for the image display apparatus, it is possible to substantially increase the time which an be allotted to write the data into the memory array 1 from the random port, while improving the describing speed. However, since the serial port is used exclusively to output the data onto the CRT and the memory itself does not provide a function which enables the continuous writing of data such as the dynamic image A considerably complicated circuit has to be installed outside the memory in order to display the dynamic images by the conventional image display apparatus.

SUMMARY OF THE INVENTION

An object of the present invention is therefore to provide a multi-port memory capable of transferring data to a memory array so as to display a dynamic picture image or the like at an arbitrary position with the desired size on the screen in a simple circuit structure.

In order to achieve the aforementioned objective, in a first embodiment of the present invention, a semiconductor memory is provided having a memory array with a random access function, a first serial access memory with at least one serial output function, a second serial access memory with at least one serial input function, memory means for storing transfer mask data to control the transfer of serial data, and means for controlling the transfer of serial data from the second serial access memory to the memory array per every bit in accordance with an output of the memory means.

According to a second embodiment of the present invention, a semiconductor memory includes a first register which takes input data serially in synchronization with clocks, input means for inputting transfer mask data to control the transfer of serial data, a selector which selects either the data from the transfer mask input means or the transfer mask data generated inside the memory, a second register which takes output signals of the selector, and control means for controlling per every bit a transfer gate to transfer the serial data in accordance with an output of the second register are provided.

According to a third embodiment of the present invention a semiconductor memory includes a a serial data input means, a first register which takes input data from the serial data input means in synchronization with clocks, transfer mask data input means for inputting transfer mask data to control the transfer of serial data, a second register which takes data from the transfer mask data input means synchronously when the first register takes the input data from the serial data input means, address signal input means for indicating a bit at the starting position where the first and second registers start to take in the data, a serial address counter which counts the clock cycles after taking an address signal from the address signal input means and generates a serial address sequentially moving from the bit position where the first and second registers start to take in the input data to a bit position of more significance, a serial bit selector which selects the bit position indicated by the serial address, a transfer gate to transfer the content of the first register to a memory array, and control means for controlling per every bit a transfer control signal input to the transfer gate in accordance with an output of the second register.

According to a fourth embodiment of the present invention, a semiconductor memory includes a there serial data input means, a first register which takes input data from the serial data input means in synchronization with clocks, a second register which takes transfer mask data synchronously when the first register takes the input data from the serial data input means, address signal input means for indicating a bit at the starting position where the first and second registers start to take in the data, a serial address counter which counts the clock cycles after taking an address signal from the address signal input means and generates a serial address moving sequentially from the bit position where the first and second registers start to take in the input data to a bit position of more significance, a serial bit selector which selects the bit position indicated by the serial address, a transfer gate to transfer the content of the first register to a memory array, and control means for controlling per every bit a transfer control signal input to the transfer gate in accordance with an output of the second register.

The semiconductor memory embodied by the present invention in the above-described structure can transfer the data for displaying a window of the dynamic picture image or the like at a desired position on the screen to a memory array in accordance with the input data from a serial port, thus making it possible to constitute an image display apparatus capable of displaying the dynamic picture image on a multi-window with a simple structure.

BRIEF DESCRIPTION OF THE DRAWINGS

These and other objects and features of the present invention will become clear from the following description taken in conjunction with the preferred embodiment thereof with reference to the accompanying drawings throughout which like parts are designated by like reference numerals, and in which:

FIG. 3 is a diagram of an example of the transfer of data;

DETAILED DESCRIPTION OF THE PREFERRED EMBODIMENT

The present invention provides a semiconductor memory device which includes a serial port for storing the serial data such as dynamic picture image or the like, a dual-port memory which has a random port for writing and reading to an arbitrary position of a memory array and a serial port for outputting display data to CRT.

Figure 8:
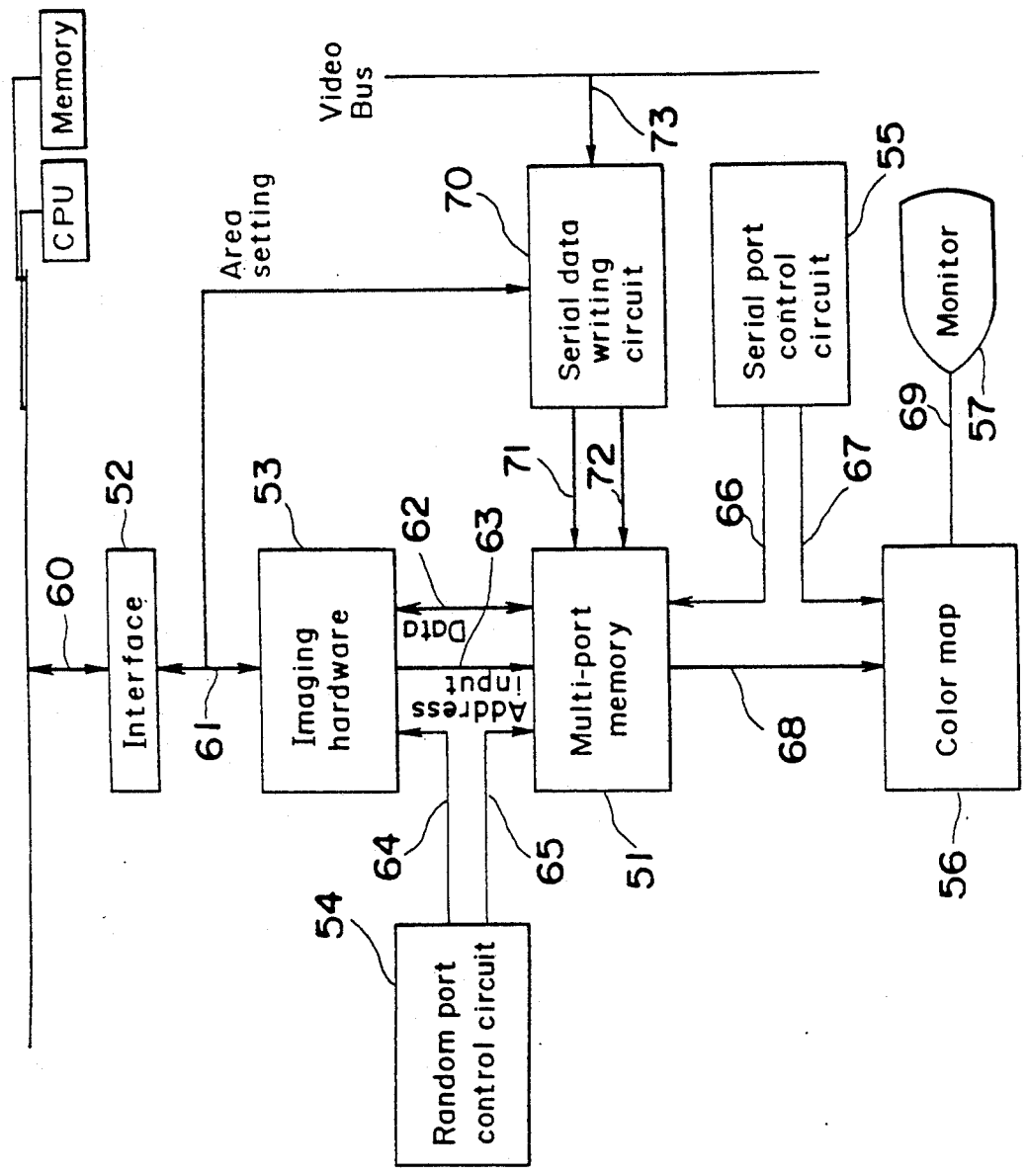
FIG. 8 is a block diagram showing an image displaying system to which a multi-port memory according to the present invention is applied.

FIG. 8 shows a system having a color monitor 57 connected to a color map 56 via a line 59 to which a multi-port memory 51 according to the present invention is applied.

In this system, the color map 56 is connected, via a video data bus 68, to the multi-port memory 51 and the color map 56 and the multi-port memory 51 are controlled by a serial port control circuit 55 through lines 66 and 67. The multi-port memory 51 is connected to an imaging hard-ware 53 via a data bus 62 and an address bus 63.

Both the multi-port memory 51 and imaging hardware 53 are controlled by the random port control circuit 54 via lies 64 and 65, respectively. The imaging hard-ward 53 is connected, via a line 61, to an interface 52 which is connected to a standard bus 60. The multi-port memory 51 is connected to a serial data writing circuit 70 via serial data line 71 and serial mask line 72.

The multi-port memory 51 stores images to be displayed on the color monitor 56. The information stored in the multi-port memory 51 is transmitted, via a video data bus 68, to the color map 56 sequentially and displayed by the color monitor 56. The serial port control circuit 55 controls the transfer of the information stored in the multi-port memory 51. To alter the information stored in the multi-port memory 51 through the imaging hard-ware 53 in order to change the image to be displayed on the color monitor 57, the standard bus 60 transmits suitable commands to the imaging hard-ware 53 via the interface 52. The random port control circuit 54 controls alteration of the information stored in the multi-port memory 51 according to the information received by the imaging hard-ware 53 through the bus 61. Addresses of the information to be altered and data for the alteration are supplied through the address bus 63 and data bus 62, respectively. The standard bus 60 is connected to an external computer and character data and graphic data composited by the computer are transmitted to the imaging hard-ware 53 through the standard bus 60. To alter the information stored in the multi-port memory 51 through the serial data writing circuit 70, serial data is supplied form the serial data bus 73. Data regarding an area of the multi-port memory 51 to be altered is sent from the standard bus 60 to the serial data writing circuit 70 via the interface 52. The serial data writing circuit 70 transfers serial data lines to the area of the multi-port memory 51 to be altered through the serial data line 71 and serial mask line 72 according to data received. Thus, the information of the multi-port memory 51 is corrected and thereby, the image on the color monitor 57 is altered.

Figure 1:
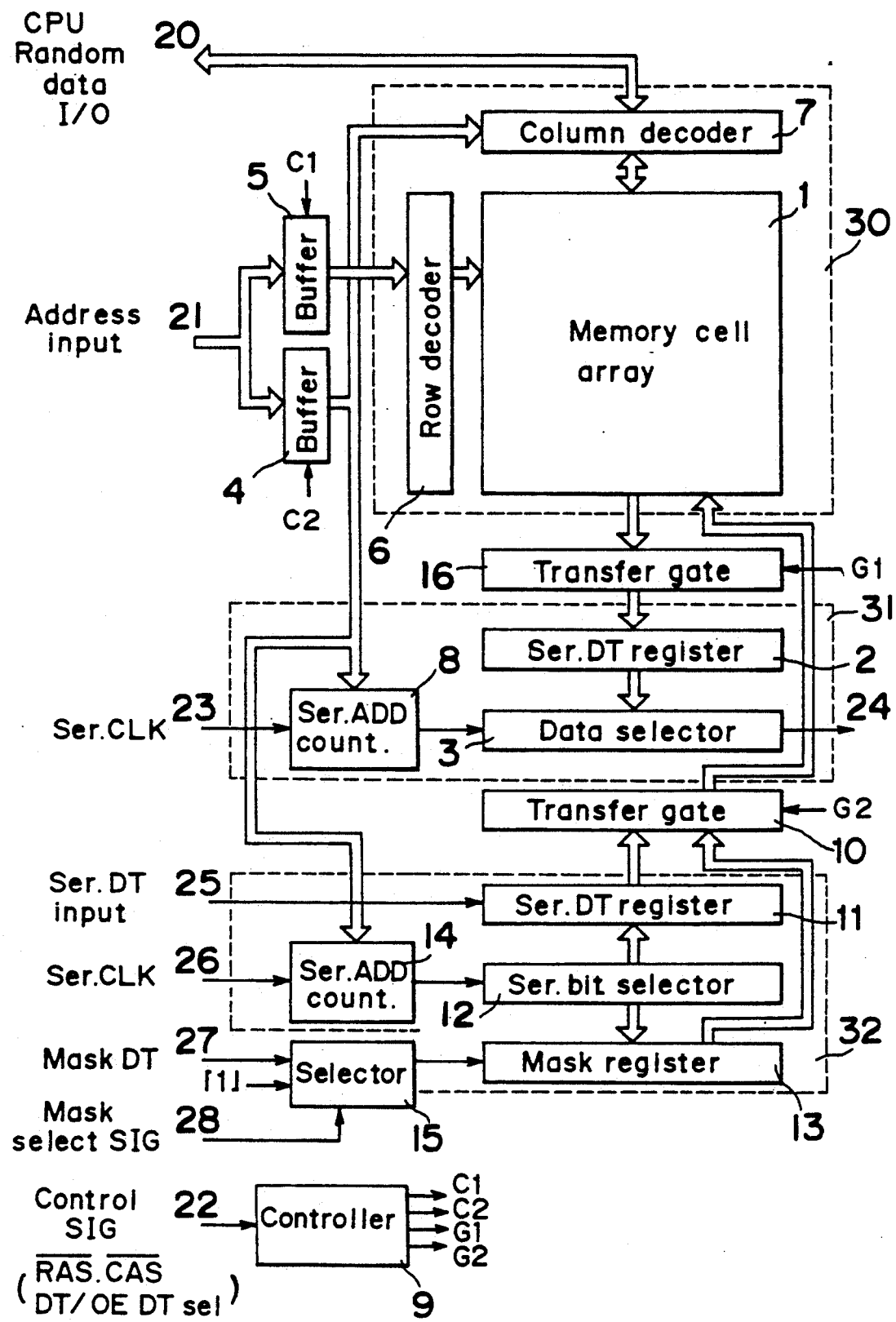
FIG. 1 is a structural diagram of a multi-port memory according to one preferred embodiment of the present invention.

FIG. 1 is a structural diagram of a multi-port memory 51 according to one embodiment of the present invention. In FIG. 1, a random access memory 30 comprises a memory cell array 1, a row decoder 6 and a column decoder 7, a first serial access memory 31 comprises a first serial data register 2 for storing transfer data from the memory cell array 1, a first serial address counter 8 for counting serial clock cycle and a data selector 3 for selecting the data at an optional bit position stored in the serial data register 2 in accordance with an output from the first serial address counter, Multi-port memory 51 further comprises a first transfer gate 16 and buffers 4, 5 which are in the same structure and with the same function as shown of the conventional example of FIG. 6.

Figure 6:
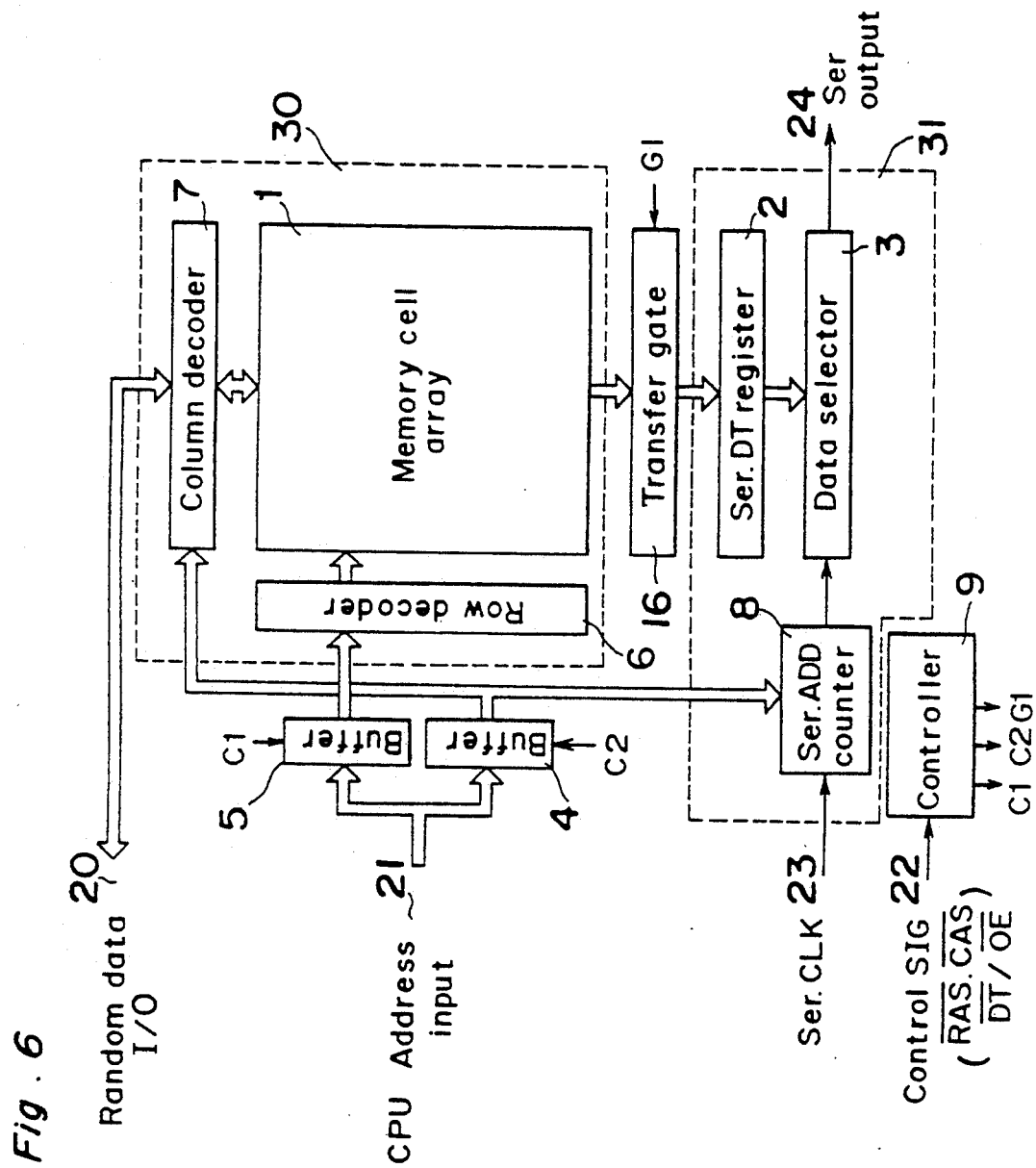
FIG. 6 is a structural diagram of a conventional dual-port memory.
Figure 7:
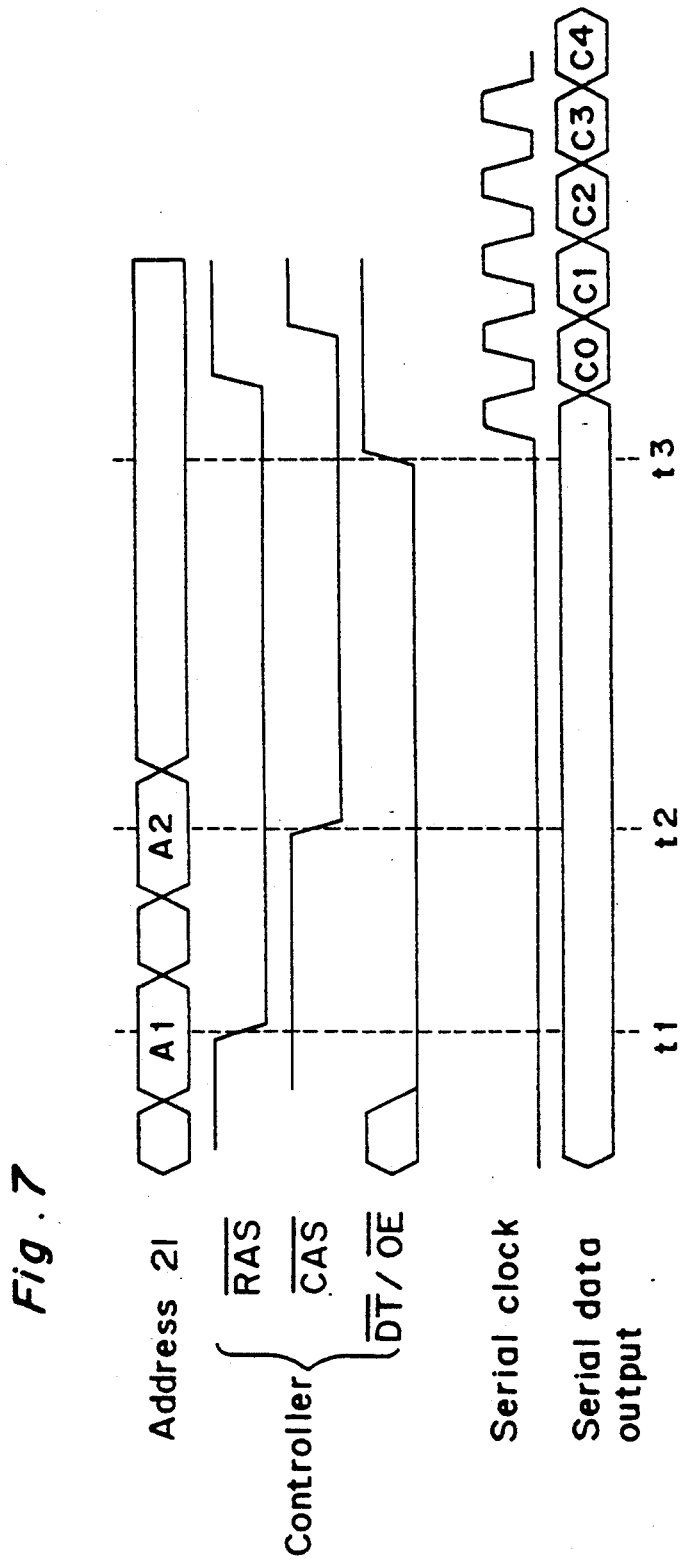
FIG. 7 is a timing chart of the memory of FIG. 6 when the serial data is transferred and output.

As is apparent from comparison of FIG. 1 with FIG. 6, a second serial access memory 32 is provided in addition to the first one in the present preferred embodiment of the invention.

The second serial access memory 32 is comprised of a second serial data register 11 for storing transfer data to the memory cell array 1, a mask register 13 for storing transfer mask data to control the transfer of data to the memory cell array 1 from the second serial data register 11 per every bit, a second serial address counter 14 for counting serial clock cycles and a serial bit selector 12 for selecting the bit positions of the second serial data register 11 and mask register 13 in accordance with an output of the serial address counter 14.

The second serial address counter 14 functions in the same manner as the first serial address counter 8. The second serial data register 11 takes in the data from a serial data input terminal 25 to a bit position indicated by an output of the serial bit selector 12, and the mask register 13 takes in an output of the selector 15 to a bit position indicated by the output of the serial bit selector 12. The serial bit selector 12, similar to the data selector 3, indicates an arbitrary bit position for the second serial data register 11 in accordance with an output of the second serial address counter 14 and indicates also the same bit position for the mask register 13 as the second serial data register 11. A selector 15 is a circuit to switch the mask data to be input to the mask register 13 between the data input through a mask data input terminal 27 and the data fixed to logic "1" in accordance with a signal from a mask selection signal input terminal 28.

Terminals of input/output signals and a control signal to realize input/output means of signals to the multi-ports memory are designated by reference numerals 20–28. Reference numerals 20–22 are signal terminals of the random port, specifically, 20 being an input/output terminal of random data, 21 being an input terminal of an address signal and 22 being an input terminal of a control signals. Control signals sent to the control signal input terminal 22 are input to a controller 9 thereby to control the operation inside (i.e., internal) the memory. On the other hand, references 23–28 show signal terminals of the serial port, 23 being a first input terminal of serial clock cycles clocks which the first serial address counter 8, uses for counting upward 24 being an output terminal of serial data through which serial data stored in the first serial data register 2 is outputted, 25 being an input terminal of serial data for inputting serial data to the second serial data register 11, 26 being a second input terminal of serial clock cycles which the second serial address counter 14 uses for counting upward 27 being an input terminal of transfer mask data which is inputting the mask register 13 and 28 being an input terminal of mask selection signals to switch the selector 15.

When the image data is written in and read out from an arbitrary position of the memory cell array 1 from the random port and, when the serial data is read out from the serial data output terminal 24, the memory device of the present invention operates in the same fashion as the conventional one shown in FIG. 6.

The following description is related to the transferring operation when the serial data is input from the serial data input terminal 25 to the second serial data register 11 and the content of the second serial data register 11 is controlled and transferred to the memory cell array 1 per every bit. In the following description selector 15 selects and outputs the transfer mask data from the transfer mask data input terminal 27, not the data fixed to logic "1", to the mask register 13.

A serial address input to the address signal input terminal 21 is loaded in the second serial address counter 14. The serial bit selector 12 selects the bit position of the second serial data register 11 designated by the serial address from the second serial address counter 14, so that the input data from the serial data input terminal 25 is written into the selected bit position of the second serial data register 11. At the same time, the serial bit selector 12 selects the same position (i.e., the bit position of the second serial data register 11) as a bit position of the mask register 13 to write the transfer mask data from the transfer mask data input terminal 27. As serial clock cycles form the second serial clock input terminal 26 are counted by the second serial address counter 14, the bit position of the second serial data register 11 selected by the serial bit selector 12 is moved one by one to a higher bit position and accordingly, the data fed to the serial data input terminal 25 is sequentially written into consecutive bits of the second serial data register 11 and the transfer mask data given to the transfer mask data input terminal 27 is sequentially written into consecutive bits of the mask register 13. Outputs of the second serial data register 11 and mask register 13 are both sent to a second transfer gate 10, when the content of the second serial data register 11 is transferred to one line of the memory array 1 which is selected by the row address in the memory array 1 input through the address signal input terminal 21 and a control signal input through the control signal input terminal 22. At this time, since the mask data of the mask register 13 is a control signal through transfer or to prohibit the transfer to the second transfer gate 10 per every bit, only the required bits corresponding to the mask data written into the mask register 13 can be transferred to the memory array 1.

Figure 2:
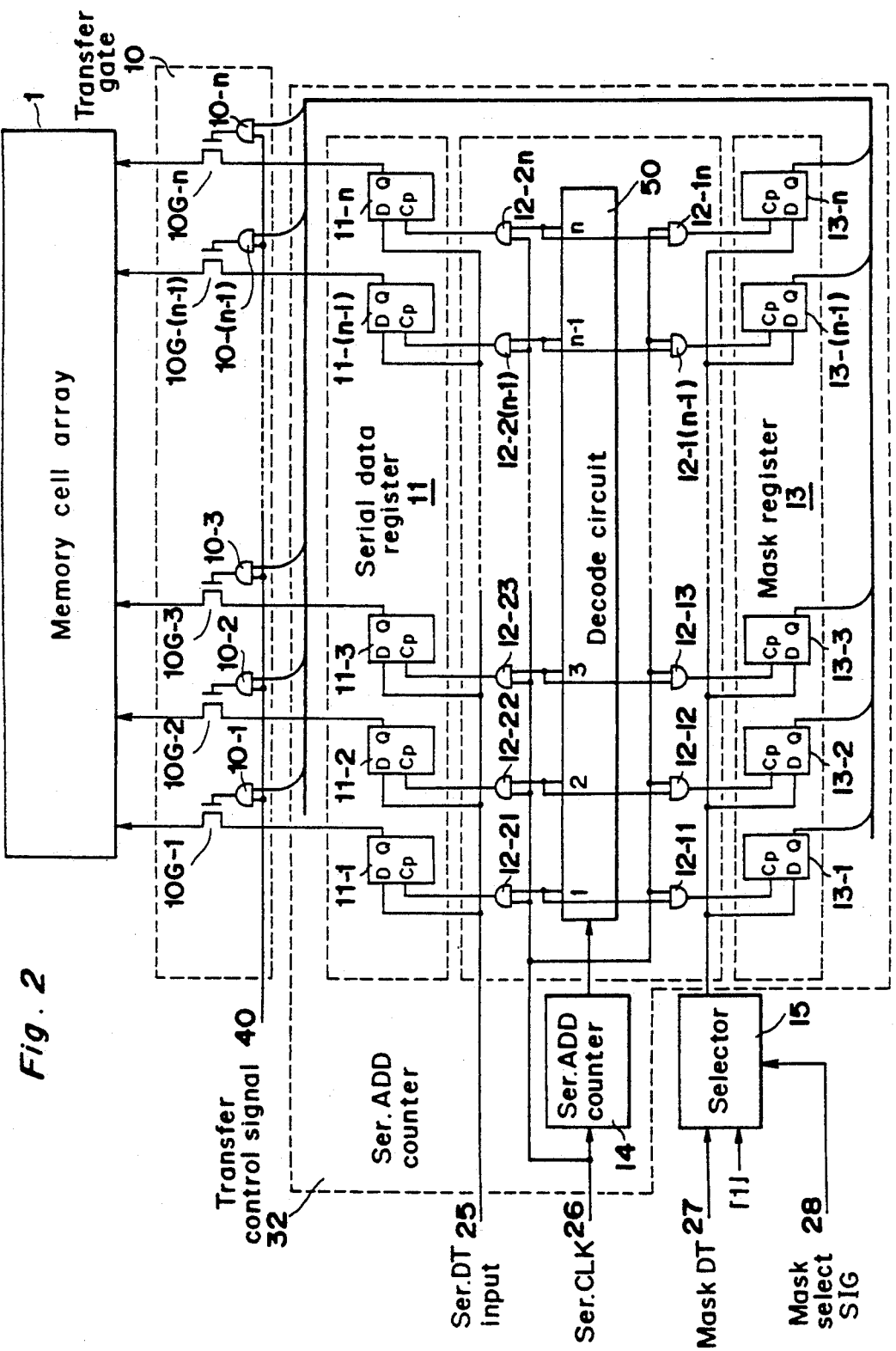
FIG. 2 is a circuit diagram of a transfer gate, a data register, a data selector and a mask register in the multi-port memory of FIG. 1.

FIG. 2 illustrates an example of the circuit structure of the transfer gate 10, second serial data register 11, serial bit selector 12 and mask register 13. The serial bit selector 12 is comprised of a decoder circuit 50, AND gates 12-11 to 12-1$n$ and AND gates 12-21 to 12-2$n$. The decoder circuit 50 receives a serial address from the second serial address counter 14 and outputs a signal to turn only one of the outputs 1 to n to logic "1" so as to select one bit of each of the second serial register 11 and mask register 13. The decoder circuit 50 is formed in the same structure as the column decoder 7. Outputs 1 to n of the decoder circuit 50 are input to the AND gates 12-11 to 12-1$n$ and AND gates 12-21 to 12-2$n$ to which a serial clock 26 is input. Therefore, in the arrangement as above, the serial clock is sent to the output of only one of the AND gates 21-11 to 12-1$n$ to the output of the one gate among AND gates 12-21 to 12-2$n$.

The second serial data register 11 is comprised of latch circuits 11-1 to 11-$n$. The serial data from the serial data input terminal 25 is input to a data input D of each latch circuit. A clock input terminal Cp of each latch circuit is connected to an output of respective AND gates 12-21 to 12-2$n$ of the corresponding bit. When a serial clock is input to the second serial clock input terminal 26, as described earlier, the serial clock is output from only one of the gates among the AND gates 12-21 to 12-2$n$ by the action of the serial bit selector 12, and supplied only to the latch circuit connected to this one gate. Accordingly, the serial data from the serial data input terminal 25 is written in the latch circuit connected to the AND gate to which the serial clock is output.

Meanwhile, the mask register 13 comprises latch circuits 13-1 to 13-$n$. An output of the selector 15 is connected to a data input D of each latch circuit. A clock input terminal Cp of the latch circuit is connected to an output of the AND gate 12-11 to 12-1$n$ of the corresponding bit. Since the AND gates 12-11 to 12-1$n$ drive in the same manner as the AND gates 12-21 to 12-2$n$, the output of the selector 15 is written into the latch circuit of the same bit position where the serial data is written.

The counting number of the second serial address counter 14 increases by one for each cycle of the second serial clock 26, thereby moving the bit position of the output, i.e., logic "1" of the decoder circuit 50 sequentially to a higher bit position of more significance. Accordingly, both the bit position of the latch circuit within the second serial data register 11 where the serial data 25 is written and the bit position of the latch circuit within the mask register 13 where the output of the selector 15 is written are sequentially moved, whereby outputs from the serial data input terminal 25 and selector 15 are, in synchronization with the second serial clock 26, written sequentially into the latch circuits of the second serial data register 11 and mask register 13.

The second transfer gate 10 is comprised of data transfer gates 10G-1 to 10G-$n$ and AND gates 10-1 to 10-$n$. As shown in FIG. 2, each output of the second serial data register 11 is connected to one side of the corresponding gate transfer 10G-1 to 10G-$n$, while each output of the mask register 13 is connected to one input of the corresponding AND gate 10-1 to 10-$n$. The other input of the AND gates 10-1 to 10-$n$ is connected to a transfer control signal 40 from the controller 9. The output of each AND gate 10-1 to 10-$n$ is connected to a gate terminal of the corresponding transfer gate 10G-1 to 10G-$n$. The transfer control signal 40 is sent to the output of the AND gates 10-1 to 10-$n$ corresponding to the bits of the output of the mask register 13.

As described hereinabove, AND gates 10-1 to 10-$n$ comprise means for controlling the transfer control signal fed to the transfer gates 10G-1 to 10G-$n$ from the outputs of the mask register 13. At the same time, the mask register 13, AND gates 10-1 to 10-$n$ and transfer gates 10G-1 to 10G-$n$ constitute means for controlling the transfer of serial data from the second serial access memory 32 to the random access memory 30 per every bit.

A function of the selector 15 is to switch the transfer mask data as described hereinbelow. FIG. 3 is a diagram explanatory of the operation when the data from the transfer mask data input terminal 27 is selected and loaded into the mask register 13. In the event that data of a transfer line Y is transferred form the serial data register 11 to the memory cell array 1 to display dynamic picture images at three windows A, B, C on the screen, data of one line is written in the second serial data register 11 and mask register 13 from the serial data input terminal 25 and transfer mask data input terminal 27 respectively in synchronization with the serial clock 26. Data (a section W in FIG. 3) of the second serial data register 11 corresponding to the transfer bit of the mask register 3 is transferred to the corresponding position to the line Y of the memory array 1. In the manner as above, the transfer mask data can be set at an arbitrary bit position, and therefore, the desired data can be transferred to a desired optional position on the screen by feeding the transfer mask data from the transfer mask data input terminal 27 to the mask register 13. This is useful when the data from the serial port is transferred to a plurality of windows as illustrated in the diagram.

Figure 4:
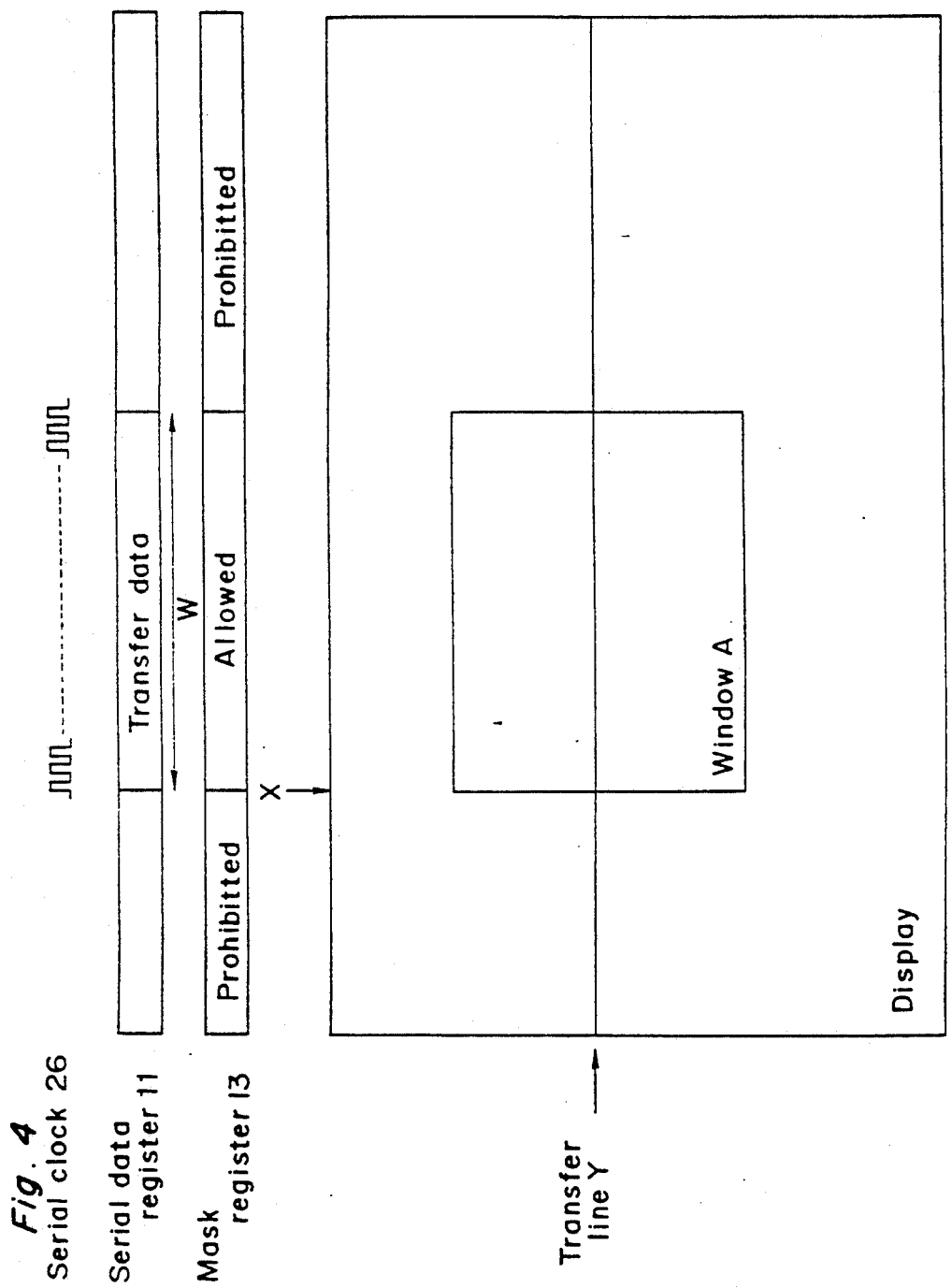
FIG. 4 is a diagram explanatory of another example of the transfer of data.

FIG. 4 explains the operation when a logic "1" is selected and input to the mask register 13. A logic "1" indicates transfer. If data of the line Y is transferred from the second serial data register 11 to the memory cell array 1 to display a dynamic picture image at a window A on the screen, an address of the starting bit position X where data is initially to be written in the second serial data register 11 is loaded in the second serial address counter 13. Then the second serial clock 26 is fed for the number of bits of data necessary for the transfer. Accordingly, the data of the necessary number of bits are written in the second serial data register 11 from the serial data input terminal 25. At the same time, a logic "1" to indicate the transfer is written into the same bit position of the mask register 13 ad the second serial data register 11. When the data (a section W in the diagram) of the second serial data register 11 corresponding to the transfer bit of the mask register 13 is transferred to a position of the memory array 1 corresponding to the line Y, the data of the window A is transferred onto the screen. Accordingly, if the data to indicate the transfer is given as data to be written into the mask register 13, the data of the necessary bit width can be transferred to an arbitrary position by writing the data of only the number of bits desired to be transferred into the second serial data register 11. Therefore, the time to input serial data can be reduced, enabling high-speed operation. Moreover, since the data corresponding to a window is possible to be transferred to a desired position on the screen, the present invention is most effective for the case where the data from the serial port is transferred to one window as indicated in FIG. 4. Although logic "1" is defined as the logic level indicating the transfer of data in the foregoing description, a logic "0" may be the data to indicate the transfer depending on the circuit structure, with the same function achieved.

Figure 5:
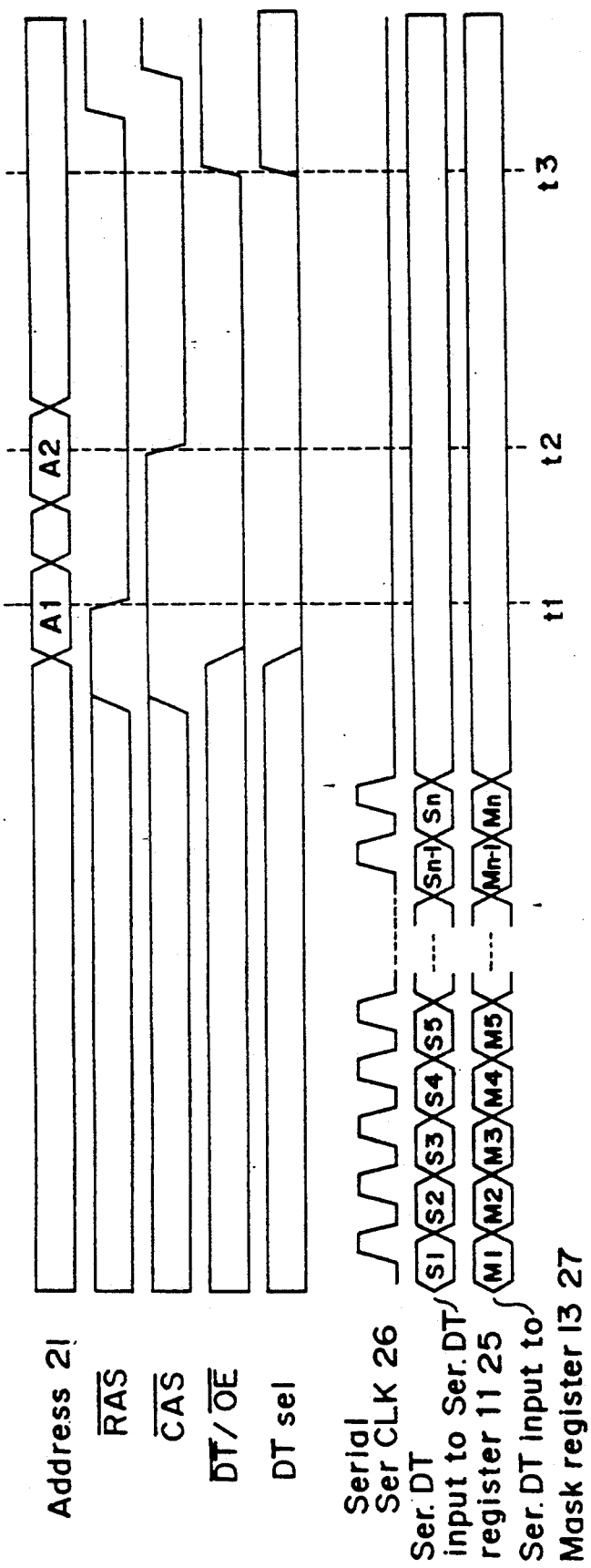
FIG. 5 is a timing chart of the memory of FIG. 1 when serial data is input and transferred.

FIG. 5 is a timing chart when the serial data is written and transferred while the selector 15 is controlled by the mask selection signal 28 so that a signal from the transfer mask data input terminal 27 is input to the mask register 13. As shown in FIG. 5, a $\overline{RAS}$ signal to control the input timing of the row address, a $\overline{CAS}$ signal to control the input timing of the column address, a $\overline{DT/OE}$ signal indicative of the transfer cycle of the serial data and a DTsel signal to control the transfer of the serial data are input to the control signal input terminal 22.

Serial data 25 and transfer mask data 27 which are input in synchronization with the rising edge of the second serial clock 26 are written in the second serial data register 11 and mask register 13, respectively. A line address A1 of the memory array 1 to perform transfer of the serial data from the address input terminal 21, a signal of logic "0" indicating the transfer cycle of the serial data as the $\overline{DT/OE}$ signal and a signal of logic "0" as the DTsel signal which indicates that the transfer cycle transfers the signal of the second serial data register 11 to the memory array 1 are input at time t1 when the $\overline{RAS}$ signal falls. As a result, the data of the serial data register 11 is transferred to the selected on line of the memory array 1 at time t3 when the $\overline{DT/OE}$ signal rises. An address indicating the starting position to write into the second serial data register 11 and mask register 13 by a next serial clock 26 is loaded in the serial address counter 14 by an address A2 input at time t2 when the $\overline{CAS}$ signal falls.

When the logic "1" is input to the mask register 13 as the transfer mask data by controlling the selector 15, the memory operates in the same manner as shown in FIG. 5. However, since it is enough to write only the necessary number of bits for the transfer into the second serial data register 11 and mask register 13, the serial data can be input in a reduced time.

When using the multi-port memory of the present invention, such an image display apparatus is realized in a simple structure that can display the dynamic picture image, for example, television image or the like at a window on the same screen simultaneously with the image data of figures, characters, etc. constructed on the computer. Moreover, the dynamic picture images can be displayed at a plurality of windows at optional positions on the screen with high speeds.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A multi-port memory which is a semiconductor memory device comprising:
   a memory array comprising means for a random access function;
   a first serial access memory comprising a first data register for retrieving data stored in the memory array serially in synchronization with a first clock;
   a second serial access memory comprising a second data register for storing input data serially in synchronization with a second clock, transfer mask data input means for inputting transfer mask data to control the transfer of serial data to the memory array and a third data register for storing the transfer mask data from the transfer mask data input means in synchronization with the second clock; and
   control means for controlling the transfer of each bit of serial data from the second serial access memory to the memory array in accordance with outputs from the third data register.

2. The multi-port memory of claim 1 wherein the second serial access memory further comprises:
   a selector means which selects either the transfer mask data from the transfer mask data input means or the transfer mask data generated inside the memory.

3. The multi-port memory of claim 1 wherein the second serial access memory further comprises:
   address signal input means for designating a starting bit position where said second and third registers start to load the said input data and said transfer mask data, respectively;
   a serial address counter which counts the number of clock cycles after loading an address signal from said address signal input means so as to generate a serial address moving sequentially upward form said starting bit position to a more significant bit position; and
   a serial bit selector which selects the bit position designated by said serial address counter;
   whereby only the data of the desired bits stored in the second register are transferred to the memory array.

4. The multi-port memory of claim 1 wherein the first serial access memory comprises:
   a serial data output port;
   a serial data register for storing data transferred from the memory array; and
   means for transferring an arbitrary number of data bits stored in the serial data register to the serial data output port in a sequential manner.

5. The multi-port memory of claim 1 wherein the memory array comprises a random port for reading and writing data in the memory array.

* * * * *

UNITED STATES PATENT AND TRADEMARK OFFICE
CERTIFICATE OF CORRECTION

PATENT NO. : 5,260,905

DATED : November 9, 1993

INVENTOR(S) : Toshiki Mori

It is certified that error appears in the above-identified patent and that said Letters Patent is hereby corrected as shown below:

Column 1, Line 28, "i" should read --in--.

Column 1, Line 68, "process position" should read --process. The--.

Column 2, Line 22, "are," should read --are;--.

Column 2, Line 26, delete "a" (first occurrence).

Column 2, Line 31, "a" (second occurrence) should read --at--.

Column 2, Line 49, after "array" insert --1--.

Column 2, Line 57, "compute" should read --computer--.

Column 3, Line 61, delete "there".

Column 4, Line 61, "59" should read --69--.

Column 5, Line 5, "lies" should read --lines--.

Column 5, Line 11, "56" should read --57--.

Column 5, Line 14, "56" should read --57--.

Column 5, Line 33, "form" should read --from--.

Column 5, Line 53, "counter," should read --counter 8.--.

Column 5, Line 55, "in" should read --of--.

Column 5, Line 56, "of" should read --in--.

UNITED STATES PATENT AND TRADEMARK OFFICE
CERTIFICATE OF CORRECTION

PATENT NO. : 5,260,905

DATED : November 9, 1993

INVENTOR(S) : Toshiki Mori

It is certified that error appears in the above-identified patent and that said Letters Patent is hereby corrected as shown below:

Column 5, Line 59, delete "present".

Column 5, Line 60, after "the" insert --present--.

Column 6, Line 26, delete "a".

Column 6, Line 32, delete "clocks".

Column 6, Line 41, "inputting the" should read --input into--.

Column 7, Line 3, "form" should read --from--.

Column 7, Line 21, "through" should read --to--.

Column 7, Line 22, "to" should read --through--.

Column 7, Line 40, "output" should read --outputs--.

Column 7, Line 41, after "$12-1_n$" insert --and--.

Column 7, Line 42, "one" should read --corresponding--.

Column 8, Line 19, after "corresponding" insert --transfer--, and delete "transfer".

Column 8, Line 25, "agate" should read --a gate--.

Column 8, Line 43, "form" should read --from--.

Column 9, Line 1, "13" should read --14--.

UNITED STATES PATENT AND TRADEMARK OFFICE
CERTIFICATE OF CORRECTION

PATENT NO. : 5,260,905

DATED : November 9, 1993

INVENTOR(S) : Toshiki Mori

It is certified that error appears in the above-identified patent and that said Letters Patent is hereby corrected as shown below:

Column 9, Line 7, "ad" should read --as--.

Column 9, Line 53, "on" should read --one--.

Column 10, Line 50, "form" should read --from--.

Signed and Sealed this

Twenty-fourth Day of May, 1994

*Attest:*

BRUCE LEHMAN

*Attesting Officer*     *Commissioner of Patents and Trademarks*